US012592367B2

(12) United States Patent
Nakatani et al.

(10) Patent No.: US 12,592,367 B2
(45) Date of Patent: Mar. 31, 2026

(54) PLASMA PROCESSING APPARATUS AND MANUFACTURING METHOD OF WAFER STAGE FOR PLASMA PROCESSING APPARATUS

(71) Applicant: Hitachi High-Tech Corporation, Tokyo (JP)

(72) Inventors: Shintaro Nakatani, Tokyo (JP); Takamasa Ichino, Tokyo (JP); Chia Hsing Wei, Tokyo (JP); Yuki Tanaka, Tokyo (JP); Tomoaki Hyodo, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 77 days.

(21) Appl. No.: 18/694,088

(22) PCT Filed: Dec. 12, 2023

(86) PCT No.: PCT/JP2023/044323
§ 371 (c)(1),
(2) Date: Mar. 21, 2024

(87) PCT Pub. No.: WO2024/180858
PCT Pub. Date: Sep. 6, 2024

(65) Prior Publication Data
US 2025/0140532 A1      May 1, 2025

(30) Foreign Application Priority Data

Feb. 28, 2023    (WO) .................. PCT/JP2023/007182

(51) Int. Cl.
*H01J 37/32* (2006.01)
*H01L 21/687* (2006.01)

(52) U.S. Cl.
CPC .. *H01J 37/32724* (2013.01); *H01L 21/68757* (2013.01); *H01L 21/68785* (2013.01); *H01J 2237/334* (2013.01)

(58) Field of Classification Search
CPC ........... H01L 21/68758; H01L 21/6831; H01L 21/67109; H01L 21/67103; H01L 21/3065;
(Continued)

(56) References Cited

U.S. PATENT DOCUMENTS

| 5,558,717 A | 9/1996 | Zhao et al. |
| 5,755,511 A | 5/1998 | Peuse et al. |

(Continued)

FOREIGN PATENT DOCUMENTS

| JP | H08-227859 A | 9/1996 |
| JP | 2005-516379 A | 6/2005 |

(Continued)

OTHER PUBLICATIONS

Office Action mailed Jul. 17, 2024 in Taiwanese Application No. 113106175.

(Continued)

*Primary Examiner* — Patrick C Chen
(74) *Attorney, Agent, or Firm* — Miles & Stockbridge, P.C.

(57) ABSTRACT

A plasma processing apparatus including a metallic base material disposed inside a wafer stage and having a cylindrical shape or a circular plate shape; a dielectric film disposed on an upper surface of the base material; a film-shaped heater disposed inside the dielectric film; a refrigerant flow path disposed in a concentric shape or in a spiral shape about a center of the base material in the base material and allowing a refrigerant to flow therethrough; and at least one arc-shaped space multiply disposed about the center in (Continued)

the base material between the refrigerant flow path and the heater and having an inside reduced to a predetermined degree of vacuum and sealed. A region of a portion of the base material between the disposed arc-shaped spaces is projected and overlapped on a region of an intermediate portion of the base material that partitions two of the adjacent refrigerant flow paths.

13 Claims, 5 Drawing Sheets

(58) Field of Classification Search
CPC ................. H01J 37/32; H01J 37/32715; H01J 37/32522; H01J 37/32724
See application file for complete search history.

(56) References Cited

U.S. PATENT DOCUMENTS

| | | | |
|---|---|---|---|
| 2003/0003749 A1 | 1/2003 | Sexton et al. | |
| 2005/0193953 A1 | 9/2005 | Makino et al. | |
| 2008/0170969 A1* | 7/2008 | Yoshioka ............... | G05D 23/22 |
| | | | 422/109 |
| 2011/0297082 A1 | 12/2011 | Watanabe et al. | |
| 2015/0214014 A1 | 7/2015 | Sato et al. | |
| 2016/0378092 A1 | 12/2016 | Yamamoto et al. | |
| 2018/0211893 A1 | 7/2018 | Ichino et al. | |
| 2018/0226285 A1* | 8/2018 | Hanamachi ....... | H01L 21/67017 |
| 2019/0177849 A1 | 6/2019 | Mo et al. | |
| 2020/0177825 A1 | 6/2020 | Kitayama et al. | |
| 2020/0251315 A1 | 8/2020 | Saito et al. | |
| 2021/0000774 A1 | 1/2021 | Boudes et al. | |
| 2023/0168192 A1 | 6/2023 | Ichimura et al. | |
| 2024/0055232 A1 | 2/2024 | Tanaka et al. | |

FOREIGN PATENT DOCUMENTS

| | | | |
|---|---|---|---|
| JP | 2005-252201 A | | 9/2005 |
| JP | 2008-177285 A | | 7/2008 |
| JP | 2011-258614 A | | 12/2011 |
| JP | 2014150186 A | * | 8/2014 |
| JP | 2015-141908 A | | 8/2015 |
| JP | 2016-018918 A | | 2/2016 |
| JP | 2016-072477 A | | 5/2016 |
| JP | 2017-011169 A | | 1/2017 |
| JP | 2017-084523 A | | 5/2017 |
| JP | 2018-120881 A | | 8/2018 |
| JP | 2019-104974 A | | 6/2019 |
| JP | 2020-095020 A | | 6/2020 |
| JP | 2020-126900 A | | 8/2020 |
| KR | 10-2015-0089907 A | | 8/2015 |
| TW | 202238813 A | | 10/2022 |

OTHER PUBLICATIONS

Office Action mailed Sep. 27, 2022 in Taiwanese Application No. 111109231.
Search Report mailed Jun. 29, 2021 in International Application No. PCT/JP2021/012484.
Written Opinion mailed Jun. 29, 2021 in International Application No. PCT/JP2021/012484.
Office Action mailed Aug. 13, 2018 in Korean Application No. 10-2017-0112446.
Office Action mailed Jun. 20, 2019 in U.S. Appl. No. 15/715,717.
Office Action mailed Oct. 24, 2019 in U.S. Appl. No. 15/715,717.
Search Report mailed Apr. 25, 2023 in International Application No. PCT/JP2023/007182.
Office Action mailed Jan. 21, 2025 in Japanese Application No. 2024-518198.

* cited by examiner

[FIG. 1]
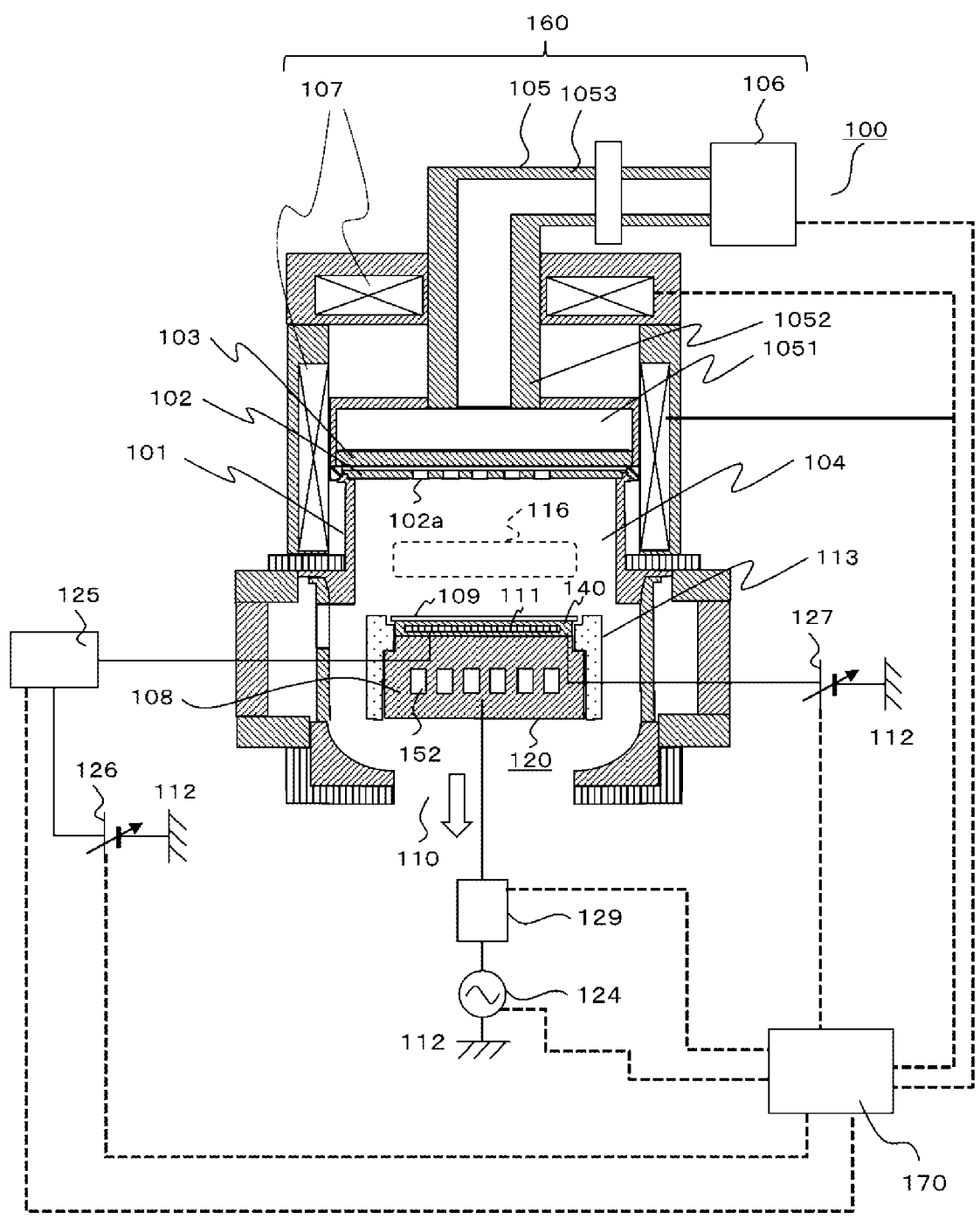

[FIG. 2]
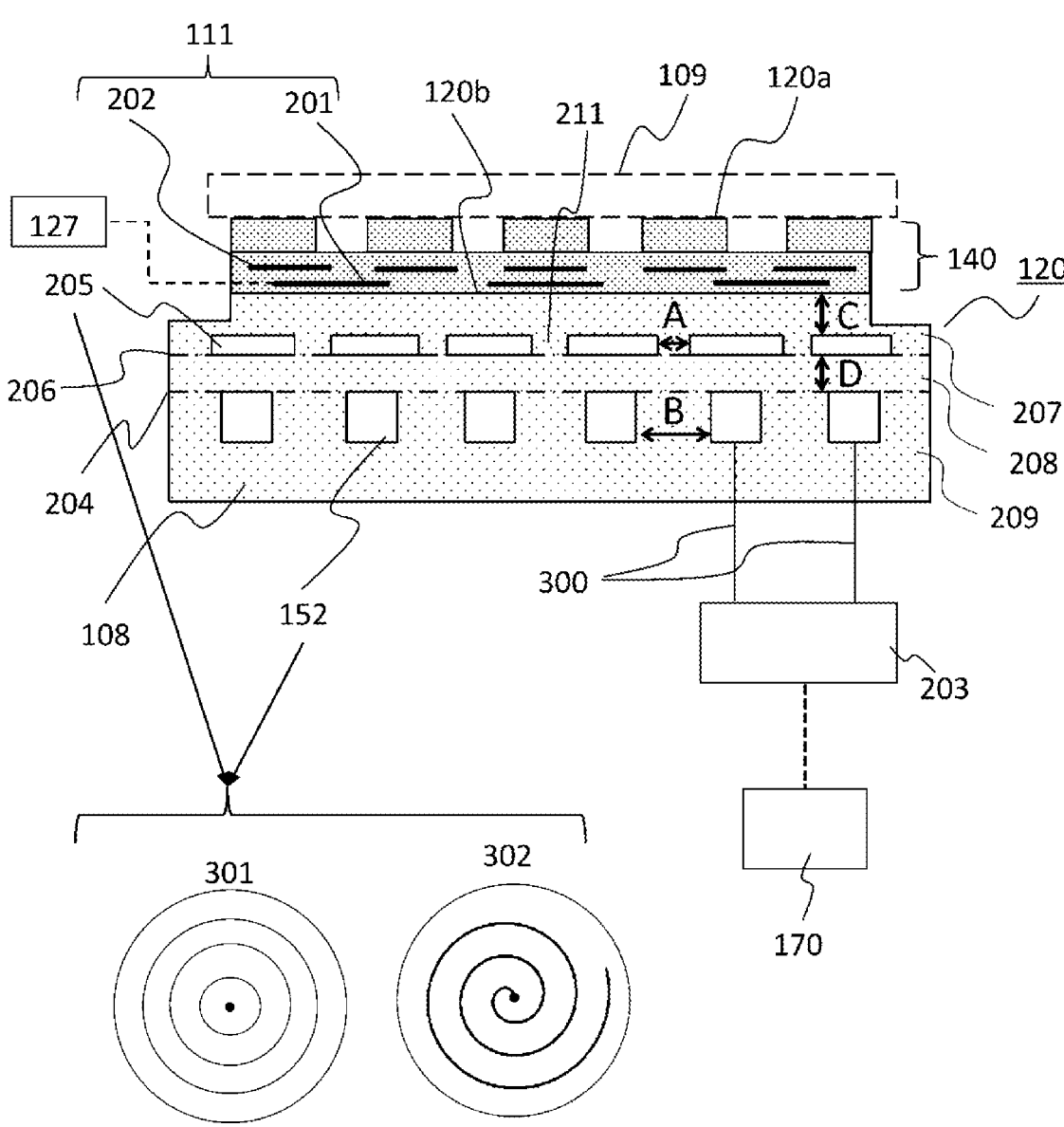

[FIG. 3]
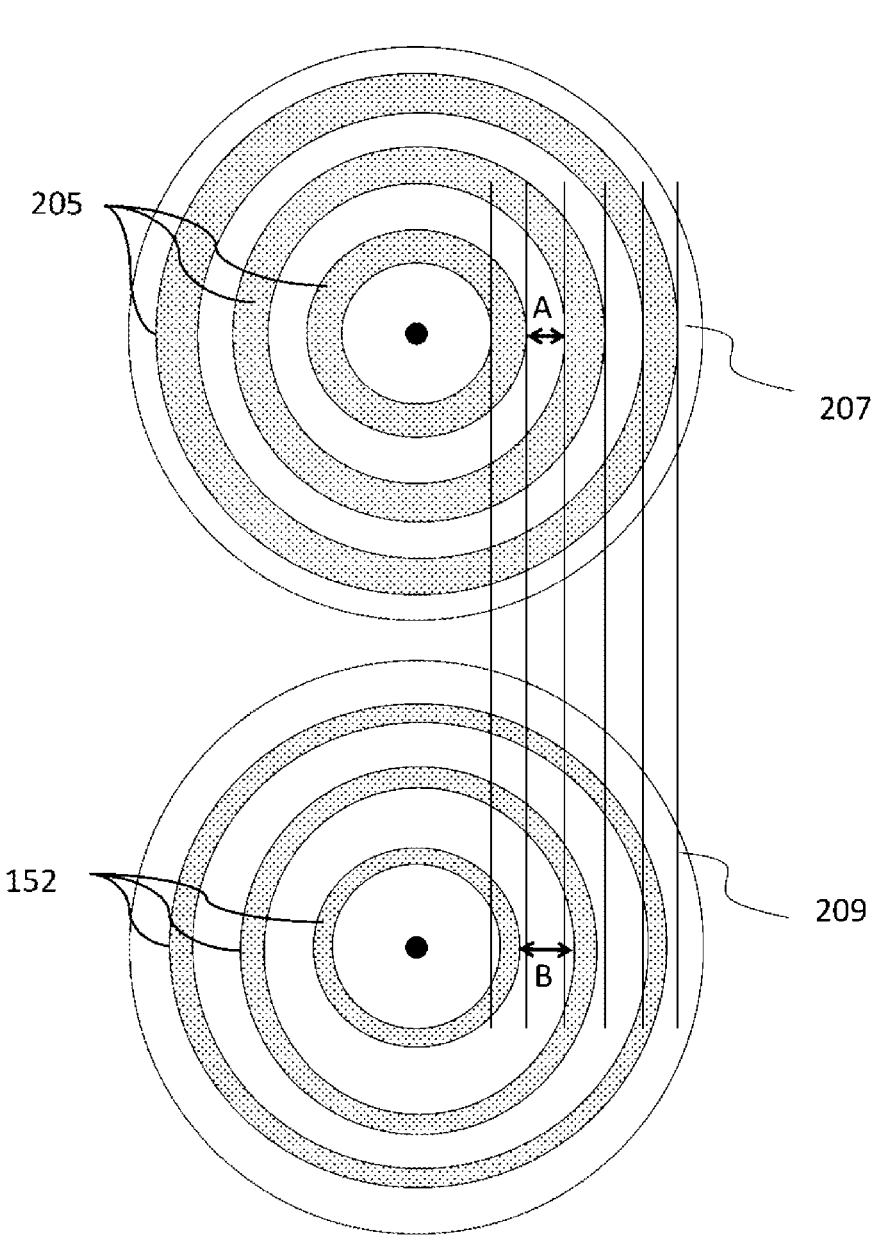

[FIG. 4]
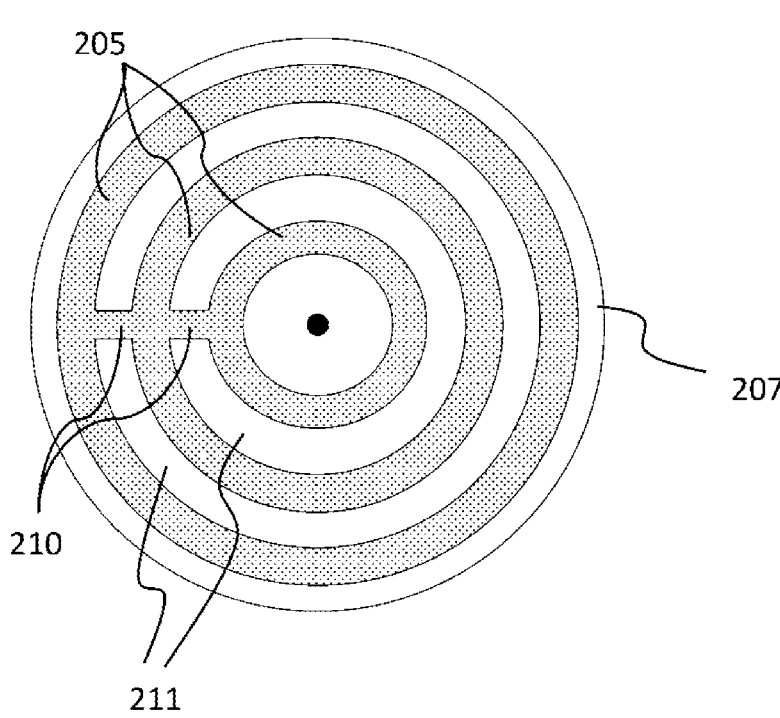
[FIG. 5]
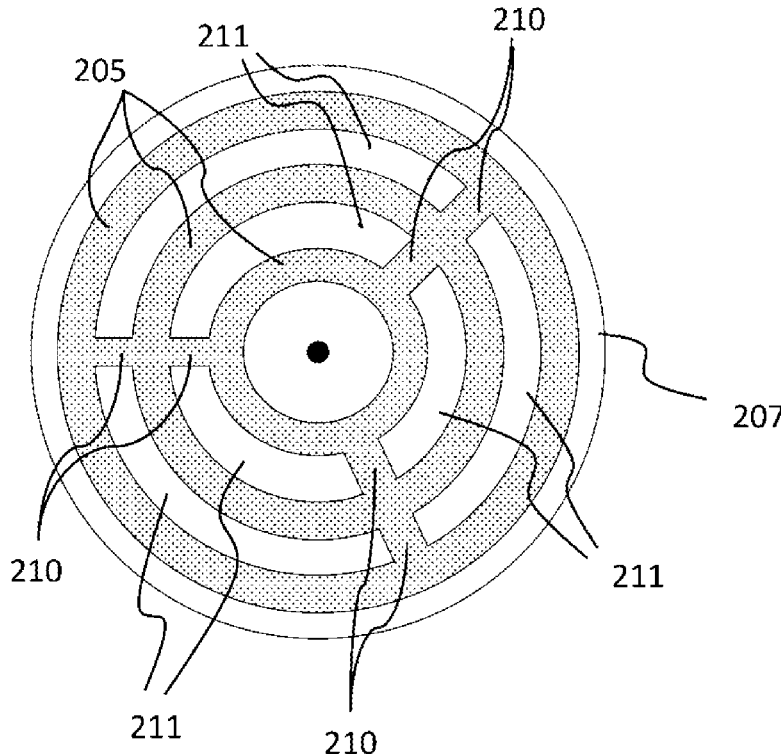

[FIG. 6A]
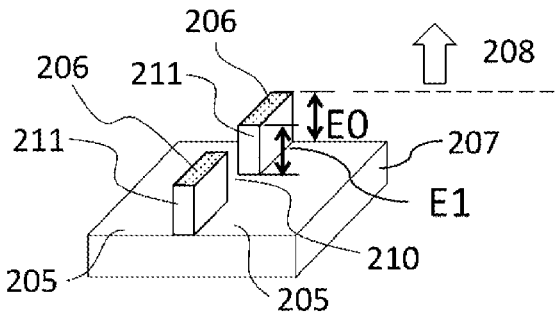
[FIG. 6B]
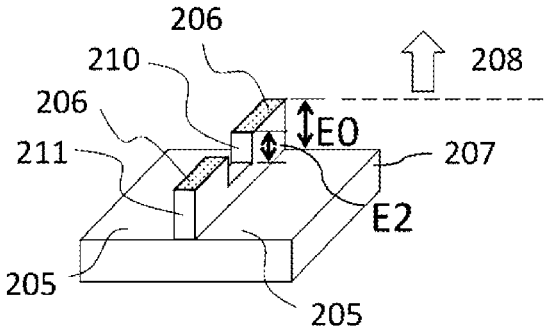

PLASMA PROCESSING APPARATUS AND MANUFACTURING METHOD OF WAFER STAGE FOR PLASMA PROCESSING APPARATUS

TECHNICAL FIELD

The present disclosure relates to a plasma processing apparatus and a manufacturing method of a wafer stage of the plasma processing apparatus, and more particularly, to a plasma processing apparatus and a manufacturing method of a wafer stage of the plasma processing apparatus that are suitable for processing a material to be processed such as a semiconductor substrate.

BACKGROUND ART

In a semiconductor manufacturing process, dry etching using plasma may be performed. Various types of plasma processing apparatuses are used to perform the dry etching.

In general, a plasma processing apparatus includes a vacuum processing chamber, a gas supply device connected to the vacuum processing chamber, a vacuum exhaust device that maintains inside the vacuum processing chamber at a desired value, an electrode (hereinafter referred to as a wafer stage) on which a sample (semiconductor wafer) that is a material to be processed is placed on an upper surface thereof, and a plasma forming unit that forms and supplies an electric field or a magnetic field for generating plasma inside the vacuum processing chamber. A member such as a shower plate having gas inlets is disposed inside the vacuum processing chamber, and a processing gas from the gas supply device is supplied into the vacuum processing chamber through a plurality of gas inlets of the shower plate. It is assumed that a plurality of layers of films including a film layer to be processed are formed in advance on a surface of the wafer that is the sample. By exciting and dissociating or ionizing the processing gas supplied into the vacuum processing chamber using the electric field or the magnetic field supplied from the plasma forming unit so as to make the processing gas turning into plasma, an etching process of the film layer to be processed formed on the surface of the wafer held on the upper surface of the wafer stage is performed.

The wafer stage on which the wafer is placed on the upper surface thereof has a function of adsorbing and holding the wafer on an upper surface of a placement surface constituting the upper surface of the wafer stage by an electrostatic force, a function of regulating a temperature of the wafer to a value within a range suitable for the etching process by using a refrigerant circulating and flowing through a flow path disposed inside the wafer stage, a heat conductive gas supplied between a back surface of the wafer and the upper surface of the wafer stage, or the like, and a function of supplying a radio frequency power to an electrode inside the wafer stage to form a bias potential, drawing the wafer, and promoting etching in a vertical direction. As the function of regulating the temperature of the wafer by the wafer stage, it is considered that a film-shaped heater is disposed inside a film formed by using a dielectric material disposed on the upper surface of the wafer stage, a quantity of a current supplied to the heater is regulated to implement a desired temperature of the wafer or a desired temperature distribution of the wafer, and the etching process of the film layer to be processed on the wafer is performed. In such a technique (wafer temperature control technique using a heater), there is an advantage that the temperature of the wafer or the temperature distribution of the wafer can be changed at a higher speed as compared with a case of changing a temperature of the refrigerant disposed inside the wafer stage.

As an example of such a technique, for example, a technique disclosed in JP2011-258614A (PTL 1) is known. In the example of PTL 1, there is shown a configuration of a wafer stage including a metallic base material disposed inside the wafer stage, a refrigerant flow path formed inside the base material and allowing a refrigerant to flow therethrough, a dielectric film disposed on an upper surface of the base material and formed by thermal spraying, a film-shaped heater disposed inside the dielectric film, an adhesive layer disposed on the dielectric film, and a sintered plate made of a dielectric material such a ceramics and connected to the dielectric film by the adhesive layer.

CITATION LIST

Patent Literature

PTL 1: JP2011-258614A

SUMMARY OF INVENTION

Technical Problem

However, the technique of PTL 1 described above may have problems since the following points are not sufficiently considered.

That is, in PTL 1, on the upper surface of the wafer stage, the dielectric film including a metal and the film-shaped heater therein covers an entire upper surface of the metallic base material. In this configuration, heat is easily released from the heater between the heater inside the dielectric film and the refrigerant flow path inside the base material. Therefore, when the temperature of the wafer or the temperature of the wafer stage is lowered, an amount of heat generated by the heater is quickly transferred to the inside of the base material and can be exchanged with the refrigerant through the flowing refrigerant flow path.

On the other hand, when the temperature of the wafer is increased to or maintained at a desired value, the heater needs to generate a large amount of heat including the amount of heat to be transferred to the base material. Therefore, when it is not necessary to rapidly decrease the temperature after the temperature of the wafer stage or the wafer is increased to process the wafer, power consumption of the heater becomes large. In addition, as the temperature of the wafer implemented by the heater is increased (raised), the amount of heat to be transferred to the base material which does not contribute to increasing and maintaining the temperature of the wafer is also increased, and thus a heater power supply with a larger capacity than necessary is required.

As described above, in the technique of PTL 1, since the power consumption for driving the heater that increases the temperature of the wafer stage or the wafer is large, a problem that an operation cost of the plasma processing apparatus is high is not considered.

An object of the present disclosure is to provide a technique (a plasma processing apparatus or a manufacturing method of a wafer stage of a plasma processing apparatus) capable of increasing a temperature of wafer or maintaining the temperature with high efficiency by a heater inside a wafer stage and preventing an increase in power consumption.

Solution to Problem

According to one embodiment, the following technique is provided.

A plasma processing apparatus has a wafer stage, the wafer stage being disposed inside a processing chamber inside a vacuum container and on which a wafer to be processed is placed on an upper surface of the wafer stage, the plasma processing apparatus being configured to process the wafer by forming plasma inside the processing chamber, the plasma processing apparatus including: a metallic base material disposed inside the wafer stage and having a cylindrical shape or a circular plate shape; a dielectric film disposed on an upper surface of the base material, made of a dielectric material, and constituting a placement surface on which the wafer is placed; a film-shaped heater disposed inside the dielectric film; a refrigerant flow path multiply disposed in a concentric shape or a spiral shape about a center of the base material inside the base material and allowing a refrigerant to flow therethrough; and at least one arc-shaped space multiply disposed about the center inside the base material between the refrigerant flow path and the heater and having an inside reduced to a predetermined degree of vacuum and sealed. A region of a portion of the base material between the multiply disposed arc-shaped spaces is projected and overlapped on a region of an intermediate portion of the base material that partitions two of the adjacent refrigerant flow paths when viewed from above.

Advantageous Effects of Invention

Advantageous effects obtained by a representative embodiment of the disclosure disclosed in the present application will be briefly described below.

That is, the temperature of the wafer can be increased or maintained with high efficiency by the heater inside the wafer stage, and the increase in the power consumption can be prevented. Accordingly, it is possible to improve processing efficiency of the plasma processing apparatus.

BRIEF DESCRIPTION OF DRAWINGS

FIG. 1 is a cross-sectional view schematically showing a schematic configuration of a plasma processing apparatus according to an embodiment of the present disclosure.

FIG. 2 is an enlarged longitudinal sectional view showing a schematic configuration of a wafer stage according to the embodiment shown in FIG. 1.

FIG. 3 is a schematic plan view showing a vacuum insulating space and a refrigerant flow path according to the embodiment shown in FIG. 2.

FIG. 4 is a plan view showing a schematic configuration of a vacuum insulating space of a wafer stage according to a modification of the embodiment illustrated in FIG. 3.

FIG. 5 is a plan view showing a schematic configuration a configuration of a vacuum insulating space of a wafer stage according to another modification of the embodiment illustrated in FIG. 3.

FIG. 6A is a perspective view showing a schematic configuration of a first configuration example having a bridge portion including a slit portion that communicates adjacent vacuum insulated spaces in a wafer stage, according to the modification shown in FIGS. 4 and 5.

FIG. 6B is a perspective view showing a schematic configuration of a second configuration example having a bridge portion including a slit portion that communicates adjacent vacuum insulated spaces in a wafer stage, according to the modification shown in FIGS. 4 and 5.

DESCRIPTION OF EMBODIMENTS

Embodiments

Hereinafter, an outline of a representative one of disclosed embodiments will be described as follows.

A plasma processing apparatus according to an embodiment includes: a vacuum container including therein a processing chamber in which plasma is formed; a wafer stage disposed in a lower portion of the processing chamber and including a placement surface on which a semiconductor wafer to be processed is placed; and an electric field and magnetic field forming unit configured to form an electric field or a magnetic field for forming the plasma in the processing chamber using a gas supplied into the processing chamber and transmit the plasma to the processing chamber.

The wafer stage further includes: a sintered body which is a circular plate-shaped sintered body constituting the placement surface and in which an electrostatic adsorption electrode for adsorbing a semiconductor wafer which is a sample to be processed by static electricity and holding the semiconductor wafer on the sintered body is disposed; a dielectric film which is disposed below the sintered body and is formed of a dielectric material; a film-shaped heater which is formed inside the dielectric film and to which DC power or AC power is supplied; a metallic base material whose upper surface is covered with the dielectric film; and a refrigerant flow path which is multiply disposed in a concentric shape or a spiral shape about a center inside the base material and through which a refrigerant circulates and flows. Further, inside the base material, there is provided a vacuum insulating space which is located between the heater and the refrigerant flow path, and which is a space multiply disposed in the concentric shape or the spiral shape about the center of the base material, an inside of which is set to at a vacuum pressure of a predetermined degree of vacuum, and which is airtightly sealed and partitioned from the outside including the processing chamber. Such a vacuum insulating space is formed by welding two upper and lower members which are welded to each other in a vertical direction and constitute at least a part of the base material, at least one of the two members including a recess portion or a groove portion disposed in the concentric shape or the spiral shape on a welding surface, in an environment in which the degree of vacuum is reduced to a predetermined degree of vacuum or a degree of vacuum close to the predetermined degree of vacuum, and airtightly sealing the space defined by the recess portion or the groove portion from a space outside the members.

In order to increase strength of the base material in a state where the upper or lower member is welded to form the base material, a surface of a top end of a wall portion partitioning the recess portion or the groove portion between the groove portions faces a welding surface of the other member to form an annular surface welded thereto. The wall portion having the surface of the top end welded to the other member and partitioning the adjacent vacuum insulating spaces is referred to as a bridge portion 211. Further, when the wafer stage is viewed from above, a projection region of the annular welding surface of the top end of the bridge portion 211 overlaps the member of the metallic base material between the adjacent refrigerant flow paths multiply disposed in the base material. That is, the bridge portion 211 is welded to the lower member above the base material of the adjacent refrigerant flow path.

The refrigerant flow path may be disposed inside the lower member, or may be disposed below the lower member and inside another member connected to the lower member and constituting the base material.

According to the above configuration, heat generated by the heater is transferred to the refrigerant circulating through the refrigerant flow path inside the base material through the lower member to which the bridge portion 211 is welded via the bridge portion 211 partitioning the vacuum insulating spaces multiply disposed inside the base material, and heat exchange occurs. Since the vacuum insulating space is located between the heater and the refrigerant flow path, a length of a heat transfer path is large, and a cross-sectional area of the path is also small. Therefore, it is possible to reduce an amount of heat transferred from the heater to the refrigerant in the refrigerant flow path to reduce the amount of heat transferred from the heater to the refrigerant in the refrigerant flow path, thereby preventing an increase in power for the heater required to implement the same wafer temperature.

Accordingly, the temperature of the wafer or the wafer stage can be increased or maintained with high efficiency by the heater inside the wafer stage. Further, an operation cost of the plasma processing apparatus for performing the etching process can be reduced.

Hereinafter, an embodiment of the present disclosure will be described with reference to the drawings.

First Embodiment

Hereinafter, an embodiment of the present disclosure will be described with reference to FIGS. 1, 2, and 3. FIG. 1 is a cross-sectional view schematically showing a schematic configuration of a plasma processing apparatus according to the embodiment of the present disclosure. FIG. 2 is an enlarged longitudinal cross-sectional view showing a schematic configuration of a wafer placement electrode 120 according to the embodiment shown in FIG. 1. FIG. 3 is a schematic plan view showing a vacuum insulating space 205 and a refrigerant flow path 152 according to the embodiment shown in FIG. 2.

A configuration example of the plasma processing apparatus according to the embodiment of the present disclosure will be described with reference to FIG. 1. In particular, the plasma processing apparatus shown in FIG. 1 is an etching processing apparatus using plasma. The etching processing apparatus uses a microwave electric field as an electric field for forming plasma, generates electron cyclotron resonance (ECR) in a processing chamber using the microwave electric field and a magnetic field to form the plasma, and performs an etching process on a film layer to be processed included in a plurality of film layers formed in advance on an upper surface of a substrate-shaped sample such as a semiconductor wafer using the plasma while using a mask layer included in the plurality of film layers as a mask.

A plasma processing apparatus 100 shown in FIG. 1 includes a vacuum container 101 having therein a processing chamber 104 in which the plasma is formed. At least a part of the processing chamber 104 has a cylindrical shape. The vacuum container 101 surrounds an outer periphery of the processing chamber 104, and an upper portion of the vacuum container 101 has a cylindrical shape. A window member 103 made of a dielectric material such as quartz and having a circular plate shape is provided on a cylindrical upper sidewall of the vacuum container 101. The window member 103 has a back surface of an outer peripheral edge portion thereof as a lid member above an upper end of the sidewall of the vacuum container 101, and constitutes a part of the vacuum container 101. A seal member such as an O-ring is disposed between the back surface of the peripheral edge portion of the window member 103 and the upper end of the cylindrical sidewall of the vacuum container 101 in a state where the window member 103 is placed on the upper end of the sidewall. Accordingly, when an inside of the processing chamber 104 in the vacuum container 101 is exhausted and depressurized, the window member 103 is pressed against the vacuum container 101, and thus the seal member is deformed, so that an inside of the vacuum container 101 or processing chamber 104 and an outside of the vacuum container 101 or processing chamber 104 are airtightly partitioned.

A vacuum exhaust port 110 having a circular opening facing a space in a lower portion of the processing chamber 104 is disposed in a lower portion of the vacuum container 101, and the vacuum exhaust port 110 communicates with a vacuum exhaust device (not shown) disposed at the lower portion of the vacuum container 101 and connected to the lower portion of the vacuum container 101. A shower plate 102 made of a dielectric material such as quartz having a circular plate shape is provided below a lower surface of the window member 103 at the upper portion of the vacuum container 101. The shower plate 102 faces the processing chamber 104 and constitutes a circular ceiling surface of the processing chamber 104. A plurality of gas introduction holes 102*a* that penetrate the shower plate 102 are formed in a center portion of the shower plate 102, and an etching processing gas that is a processing gas from a gas supply device (not shown) is introduced into the processing chamber 104 from above through the gas introduction holes 102*a*. A gas supply pipe or a gas pipe (not shown) connected to the gas supply device may be provided, for example, on the sidewall of the vacuum container 101 between the window member 103 and the shower plate 102.

An electric field and magnetic field forming unit 160 that forms an electric field and a magnetic field for generating plasma 116 inside the processing chamber 104 is disposed at a point on an upper side of the upper portion of the vacuum container 101. The electric field and magnetic field forming unit 160 has the following configuration and is provided in the plasma processing apparatus 100.

That is, the electric field and magnetic field forming unit 160 includes a waveguide pipe 105 and a cylindrical portion 1051. The waveguide pipe 105 is disposed above the window member 103, and an electric field of a radio frequency band of a predetermined frequency introduced into the processing chamber 104 for generating the plasma 116 is propagated therein. The cylindrical portion 1051 is disposed between a lower end portion of the waveguide pipe 105 and the window member 103, and has a diameter equal to or slightly larger than that of the window member 103. A circular ceiling of the cylindrical portion 1051 is connected to the lower end portion of the waveguide pipe 105 having a diameter smaller than that of the window member 103 above a center portion of an upper surface of the window member 103. The lower end portion of the waveguide pipe 105 is a circular waveguide pipe 1052, and a cross section of the circular waveguide pipe 1052 in a horizontal direction has a circular shape. A space inside the cylindrical portion 1051 is a cylindrical cavity in which a specific mode of the electric field of the radio frequency band propagated inside the waveguide pipe 105 is generated.

The waveguide pipe 105 includes a rectangular waveguide pipe 1053 having an axis in the horizontal direction and having a rectangular cross section, one end of the rectangular waveguide pipe 1053 is connected to an upper end portion of a circular waveguide pipe 1052 having an axis in a vertical direction, and the other end of the rectangular waveguide pipe 1053 includes an electric field generating power supply 106 that generates an electric field of a radio frequency transmitted inside the waveguide pipe 105. A predetermined frequency of the electric field oscillated by the electric field generating power supply 106 is not particularly limited, and a microwave of 2.45 GHz is used in the present embodiment.

A coil 107 that generates a magnetic field is disposed in a plurality of steps in the vertical direction around the circular waveguide pipe 1052 and the cylindrical cavity of the waveguide pipe 105 above the window member 103 of the processing chamber 104 and an outer peripheral side of the cylindrical sidewall of the vacuum container 101. The coil 107 is a solenoid coil formed of an electromagnetic stone and a yoke to which a direct current is supplied to form a magnetic field.

In the above-described configuration, a dilution gas and the processing gas whose flow rates and speeds are regulated through the gas supply device connected to a gas source (not shown) are supplied to a space between the window member 103 and the shower plate 102 through a gas supply pipe (not shown) connected to the vacuum container 101, and the processing gas is introduced into the processing chamber 104 from the gas introduction holes 102a of the processing chamber 104 in which a wafer to be processed is transported and sealed. Further, the processing chamber 104 is depressurized by exhausting the gas inside the processing chamber 104 from the vacuum exhaust port 110 by an operation of the vacuum exhaust device. An internal pressure of the processing chamber 104 is regulated to a pressure within a predetermined range based on a balance between an amount of the gas from the gas introduction holes 102a and an amount of the exhausted gas.

The microwave electric field oscillated by the electric field generating power supply 106 propagates in the waveguide pipe 105, passes through the window member 103 and the shower plate 102, and is supplied downward from above to the processing chamber 104. Further, the magnetic field generated by the direct current supplied to the coil 107 is supplied into the processing chamber 104, and interacts with the microwave electric field to generate electro cyclotron resonance (ECR). By the ECR, atoms or molecules of the processing gas are excited, dissociated, or ionized, and the plasma 116 is generated in the processing chamber 104.

A wafer placement electrode (first electrode) 120 constituting the wafer stage is disposed in the lower portion of the processing chamber 104 below a space in which the plasma 116 is formed. The wafer placement electrode 120 includes a cylindrical protruding (convex) portion on an upper center portion of the base material 108, an upper surface of the cylindrical protruding portion is higher than an outer peripheral side, and the upper surface of the convex portion includes a placement surface 120a on which a semiconductor wafer (hereinafter, also simply referred to as a wafer) 109 that is a sample (to be processed) is placed (see FIG. 2). The placement surface 120a faces the shower plate 102 or the window member 103.

As shown in FIG. 2, an upper surface 120b of a convex portion of the base material 108 constituting an upper portion of the wafer placement electrode 120 is covered with a dielectric film 140, and an upper surface of the dielectric film 140 constitutes the placement surface 120a. The dielectric film 140 is formed of a plurality of layers and a plurality of materials constituting the layers, and conductor films 111 made of a plurality of conductor films for electrostatic adsorption connected to a DC power supply 126 via a radio frequency filter 125 shown in FIG. 1 are disposed in a specific layer. The wafer placement electrode 120 is held by a susceptor ring 113. A ground point 112 indicates a point connected to a ground potential as a reference potential.

Here, the conductor film 111 is a film-shaped electrostatic adsorption electrode. An inside of the conductor film 111 is supplied with DC power for adsorbing the semiconductor wafer using static electricity, and forms an electrostatic force for adsorbing the wafer 109 by sandwiching an upper portion of the specific layer of the dielectric film 140 covering the conductor film 111. The conductor film 111 according to the present embodiment has a circular shape or a shape approximate to an extent that the conductor film 111 can be regarded as having a circular shape when viewed from above, and includes a plurality of insulated films disposed at a predetermined distance apart from one another in the horizontal direction. Accordingly, it is possible to form a different electrostatic force for each region of the conductor films 111, and it is possible to vary a magnitude of an action of adsorbing the wafer 109 depending on the region.

In the present embodiment, the plurality of film-shaped electrodes constituting the conductor films 111 may be bipolar electrodes or unipolar electrodes. When the conductor films 111 are the bipolar electrodes, different polarities are given to one end and the other end of each of the plurality of film-shaped electrodes. When the conductor films 111 are the unipolar electrodes, the same polarity is given to one end and the other end of each of the plurality of film-shaped electrodes. Although only the single conductor film 111 is disclosed in FIG. 1, in the present embodiment, a plurality of conductor films 111 which are bipolar electrostatic adsorption electrodes and to which different polarities are applied are disposed inside the specific layer of the dielectric film 140.

As shown in FIG. 1, the base material 108 having a circular shape, a circular plate shape, or a cylindrical shape made of a conductor such as a metal disposed inside the wafer placement electrode 120 is connected through a power supply path including wiring such as a coaxial cable via a radio frequency power supply 124 and a matching device 129. The radio frequency power supply (first radio frequency power supply) 124 and the matching device 129 are disposed at positions closer than a distance between the radio frequency filter 125 and the conductor film 111. Further, the radio frequency power supply 124 is connected to the ground potential as the reference potential at the ground point 112.

In the present embodiment, during the processing of the wafer 109, radio frequency power having a predetermined frequency from the radio frequency power supply 124 is supplied to the base material 108, and a bias potential having a distribution corresponding to a difference from a potential of the plasma 116 is formed above the wafer 109 adsorbed and held on the upper surface of the dielectric film 140 of the wafer placement electrode 120. In other words, the wafer stage includes the wafer placement electrode 120 to which the radio frequency power is supplied from the radio frequency power supply 124 while the plasma 116 is formed.

In addition, a plurality of film-shaped heaters 201 for regulating a temperature of a surface of the placement surface 120a or a temperature of the wafer 109 are disposed inside another layer constituting the dielectric film 140 of the wafer placement electrode 120 as described later. In the present embodiment, the other layer is a layer disposed below the specific layer in which the conductor films 111 are disposed. A heater electrode DC power supply 127 for supplying power is electrically connected to the heater 201. The heater electrode DC power supply 127 is connected to the ground potential as the reference potential at the ground point 112.

Further, the refrigerant flow paths 152 are disposed inside the base material 108 in order to set a temperature of the wafer placement electrode 120 within a range suitable for processing. The refrigerant flow paths 152 are multiply disposed about a center axis of the base material 108 or wafer placement electrode 120 in the vertical direction in a spiral shape or a concentric shape, and a refrigerant whose temperature is regulated within a predetermined range flows inside the refrigerant flow paths 152. Heat transferred to the base material 108 is subjected to a so-called heat exchange with the refrigerant, so that the heat from the heater 201 transferred to the base material 108 is extracted to an outside of the wafer placement electrode 120 by the refrigerant, and the heat inside the base material 108 is reduced.

An inlet and an outlet of the refrigerant flow path 152 to the wafer placement electrode 120 are connected to a temperature regulator (a temperature regulator 203: see FIG. 2) including a refrigeration cycle (not shown) disposed below a floor surface of a building in which the plasma processing apparatus 100 is provided and a pipe 300 (see FIG. 2), and the refrigerant circulates and flows between the temperature regulator and the refrigerant flow paths 152 of the wafer placement electrode 120. The refrigerant passing through the refrigerant flow path 152 and having a temperature changed by being subjected to the heat exchange flows into the temperature regulator via the pipe, is cooled to a temperature within the predetermined range by being subjected to the heat exchange with the refrigeration cycle, and is then supplied to the refrigerant flow paths 152 inside the base material 108 to be circulated.

In the present embodiment, the electric field generating power supply 106 and the coil 107 of the electric field and magnetic field forming unit 160, the radio frequency power supply 124, the radio frequency filter 125, the DC power supply 126, the matching device 129, or the heater electrode DC power supply 127, the temperature regulator for regulating the temperature of the refrigerant, and a device that regulates operations of the plasma processing apparatus 100 such as the vacuum exhaust device or a mass flow controller for regulating a gas supply amount, which will be described later, each include a detector that detects a state of an operation of each device such as an output, a flow rate, or a pressure, and are communicably connected to a controller 170 in a wired or wireless manner. When a signal indicating the state of the operation output from the detector provided in each device is transmitted to the controller 170, an arithmetic unit of the controller 170 reads and executes software stored in an internal storage device of the controller 170. The arithmetic unit of the controller 170 detects an amount of the state from the received signal of the detector based on an algorithm described by the software, calculates a command signal for regulating the amount to an appropriate value, and transmits the command signal to an electric field and magnetic field regulating system, a pressure regulating system, or the like. A device in the electric field and magnetic field regulating system, the pressure regulating system, or the like that receives the command signal regulates the operation according to the command signal.

In such a plasma processing apparatus 100, although not shown, a vacuum transport chamber inside a vacuum transport container which is another vacuum container is connected to the sidewall of the vacuum container 101. The vacuum transport chamber is depressurized to a pressure the same as that of the processing chamber 104, and a robot for wafer transport is disposed inside the vacuum transport chamber. A gate valve disposed in the vacuum transport chamber is provided as a gate of a passage communicating between the vacuum transport chamber and the processing chamber 104. The wafer 109 before processing is placed on an arm top end of the robot. When the gate valve is opened, the wafer 109 before processing placed on the arm top end is carried into the processing chamber 104 through the gate in a state of being placed on the arm top end by extending the arm. Further, the transported wafer 109 above the placement surface 120*a* of the wafer placement electrode 120 inside the processing chamber 104 is transferred onto lift pins by a vertical movement of the lift pins. The wafer 109 before processing is further placed on the placement surface 120*a*, and is then adsorbed and held on the placement surface 120*a* of the wafer placement electrode 120 by the electrostatic force formed by the DC power applied from the DC power supply 126.

After the transport robot exits from the processing chamber 104 into the vacuum transport chamber by contracting the arm, the gate valve airtightly closes the gate from the vacuum transport chamber, and the inside of the processing chamber 104 is sealed. In this state, the etching processing gas is supplied into the processing chamber 104 through the gas supply pipe including a gas pipe connecting the gas source and the vacuum container 101. A flow path through which the gas flows and the mass flow controller (not shown) which is a flow path regulator having a valve disposed on the flow path are disposed on a path of the gas pipe. The mass flow controller regulates a flow rate to a value within a desired range by increasing and decreasing a cross-sectional area of the flow path or opening and closing the flow path. Accordingly, the gas whose flow rate or speed is regulated is introduced into a space of a gap between the window member 103 and the shower plate 102 made of quartz from the flow path provided in the sidewall of the vacuum container 101 connected to an end portion of the gas pipe. The introduced gas is diffused in the space and then introduced into the processing chamber 104 through the gas introduction holes 102*a* of the shower plate 102.

The gas and particles inside the processing chamber 104 are exhausted through the vacuum exhaust port 110 by an operation of the vacuum exhaust device connected to the vacuum exhaust port 110. The pressure inside of the processing chamber 104 is adjusted to a predetermined value within a range suitable for processing the wafer 109 according to the balance between the supply amount of the gas from the gas introduction holes 102*a* in the shower plate 102 and the exhaust amount from the vacuum exhaust port 110.

Further, while the wafer 109 is adsorbed and held, a thermally conductive gas such as helium (He) is supplied from an opening (not shown) in the upper surface of the dielectric film 140 to a gap between the wafer 109 and the upper surface of the dielectric film 140 which is the placement surface 120*a* of the wafer placement electrode 120. Accordingly, thermal conductivity between the wafer 109 and the wafer placement electrode 120 is promoted. The temperature of the wafer placement electrode 120 or the electrode base material 108 is regulated in advance before the wafer 109 is placed by circulating the refrigerant regulated to the temperature within the predetermined range through the refrigerant flow paths 152 disposed in the electrode base material (also simply referred to as the base material) 108 of the wafer placement electrode 120. Therefore, the thermal conductivity is performed between the wafer placement electrode 120 or the electrode base material 108 having a large thermal capacity, so that the temperature of the wafer 109 is regulated to be close to these temperatures before the processing. Further, even after the processing starts, the heat from the wafer 109 is transferred to the wafer placement electrode 120 or the electrode base material 108, and the temperature of the wafer 109 is regulated.

In this state, the microwave electric field and the magnetic field are supplied into the processing chamber 104, and the plasma 116 is generated using the gas. When the plasma 116 is formed, the radio frequency (RF) power is supplied from the radio frequency power supply 124 to the electrode base material 108, the bias potential is formed above an upper surface of the wafer 109, and charged particles such as ions in the plasma 116 are attracted to the upper surface of the wafer 109 in response to a potential difference with a potential of the plasma 116. Further, the charged particles collide with a surface of a film layer to be processed exposed from the mask disposed in advance on the upper surface of the wafer 109 and the mask having a film structure including the film layer to be processed, and the surface of the film layer to be processed is subjected to the etching process. During the etching process, the processing gas introduced into the processing chamber 104 and particles of a reaction product generated during the process are exhausted from the vacuum exhaust port 110.

When it is detected by an end point detector or a film thickness detector (not shown) that an etching amount of the film layer to be processed reaches a predetermined etching amount or a film thickness of the film layer to be processed reaches a remaining film thickness as the etching process of the film layer to be processed proceeds, the supply of the radio frequency power from the radio frequency power supply 124 is stopped, the supply of the power of the electric field generating power supply 106 and the power to the coil 107 is stopped, the plasma 116 is extinguished, and the etching process is stopped. Thereafter, the power is supplied from the DC power supply 126 to the conductor film 111 for adsorbing the wafer 109 in a manner of making the potential of the electric conductor film 111 opposite to the potential during the processing, and an electrostatic adsorption force removal process is implemented. Thereafter, a rare gas is introduced into the processing chamber 104, and the processing gas in the processing chamber 104 is replaced with the rare gas.

Then, after the wafer 109 is lifted by the lift pins from the placement surface 120a of the wafer placement electrode 120, the gate valve is opened, and the wafer 109 is transferred to the arm top end of the transport robot that enters the processing chamber 104 through the gate. The wafer 109 is carried to the outside of the processing chamber 104 and carried into the vacuum transport chamber by contracting the arm. When there is another wafer 109 to be processed, the other wafer 109 is carried onto the transport robot and processed in the same manner as described above. When there is no other wafer 109, the gate valve airtightly closes the gate to seal the processing chamber 104, and the process in the processing chamber 104 is ended.

As shown in FIG. 2, the wafer placement electrode 120 according to the present embodiment includes the base material 108 and the dielectric film 140. The base material 108 has a circular plate shape and is made of a metal such as aluminum (Al) or titanium (Ti) or an alloy thereof. The dielectric film 140 is welded to the upper surface 120b of the base material 108, and vertically includes a plurality of layers made of a dielectric material such as $Al_2O_3$ in which the plurality of film-shaped heaters 201 and the plurality of electrostatic adsorption electrodes 202 are disposed. The conductor film 111 formed inside the dielectric film 140 includes the plurality of film-shaped heaters 201 and the plurality of electrostatic adsorption electrodes 202.

Inside the base material 108, the refrigerant flow path 152, which is a refrigerant passage through which the refrigerant flows, is disposed in the concentric shape or the spiral shape about the center axis of the base material 108 in the vertical direction. The inlet of the refrigerant flow path 152 through which the refrigerant is introduced and the outlet of the refrigerant flow path 152 through which the refrigerant is discharged are connected to the temperature regulator 203 outside the vacuum container 101 and the pipe 300. The temperature regulator 203 regulates the flow rate (speed) and the temperature of the refrigerant circulating through the refrigerant flow path 152 according to the command signal from the controller 170.

The refrigerant flow path 152 according to the present embodiment is formed by welding a metallic intermediate member 208 and a metallic lower member 209, which have a circular plate shape or a cylindrical shape and constitute the base material 108, at a welding surface 204 by a welding method such as brazing or diffusion welding. In the embodiment shown in FIG. 2, in the refrigerant flow path 152, recesses (dents) or grooves recessed downward from an upper surface of the lower member 209 are multiply formed in a concentric shape 301 or a spiral shape 302 about a center axis in the vertical direction. In a state where the upper surface of the lower member 209 is welded to the intermediate member 208, an upper end portion of the recess or the groove is covered and capped with a bottom surface of the intermediate member 208, and an upper end surface of a metal portion (intermediate portion) partitioning the adjacent recesses or grooves from each other and forming sidewalls thereof is airtightly welded to the intermediate member 208, so that the multiply refrigerant flow paths 152 have the concentric shape or spiral shape.

Further, inside the base material 108 above the intermediate member 208, vacuum insulating spaces (vacuum insulating layer) 205 having a minute height in the vertical direction are disposed about the center axis of the base material 108 in the vertical direction in the concentric shape 301 in order to prevent heat transfer between the heater 201 and the refrigerant flow path 152. The vacuum insulating spaces 205 are formed by welding an upper member 207 and the intermediate member 208 to each other at a welding surface 206 by a welding method such as the brazing or the diffusion welding. In the present embodiment, the upper member 207 and the intermediate member 208 are welded to each other, for example, in a vacuum environment depressurized to a predetermined degree of vacuum inside a welding processing container (not shown), and an inside of a minute gap of the vacuum insulating space 205 is formed as a sealed and closed space in which a pressure is maintained close to a pressure of the corresponding degree of vacuum.

In other words, in a manufacturing method of the wafer stage of the plasma processing apparatus, an arc-shaped space constituting the vacuum insulating space 205 is defined by welding the recessed portion formed in advance on at least one of the upper member 207 and the lower member (corresponding to the intermediate member 208 in this example), which are welded to each other to form the base material 108, and the other member in a space of the welding processing container having a degree of vacuum approximate to the predetermined degree of vacuum. The vacuum insulating space 205 may be formed in the spiral shape 302.

The vacuum insulating space 205 may communicate with the processing chamber 104 to obtain a pressure having a degree of vacuum equivalent to that of the processing chamber 104. In this case, it should be noted that the particles of the plasma 116 enter the inside of the vacuum insulating space 205 or damage or deposition of deposits occurs on an inner surface of the vacuum insulating space 205, which may cause thermal and mechanical temporal changes of the vacuum insulating space 205.

On the other hand, a pipe different from the vacuum container 101 may be connected to the vacuum insulating space 205, and a vacuum pump or a vacuum gauge may be disposed in the pipe and exhaust gas to obtain a reduced pressure. In this case, since the number of devices constituting the plasma processing apparatus 100 increases, a cost increases, and it is necessary to manage the devices in order to constantly maintain an appropriate pressure during the operation.

In the present embodiment, as one of steps of manufacturing the plasma processing apparatus 100, the base material 108 or the vacuum insulating space 205 is formed such that the internal space thereof is sealed in the welding processing container in which a predetermined vacuum pressure is maintained. Accordingly, the temporal change of the vacuum insulating space 205 and the increase in cost are reduced or prevented.

In order to ensure strength of the base material 108, the vacuum insulating space 205 has a welding surface in which adjacent recesses or grooves multiply formed on a bottom surface of the upper member 207 constituting the welding surface are divided and lower end surfaces of portions constituting the annular sidewalls of the recesses or grooves are welded to an upper surface of the intermediate member 208, and an inside of a space defined by the welding is airtightly closed and sealed with respect to the processing chamber 104. The welded portions between the respective spaces of the annularly disposed vacuum insulating spaces 205 are referred to as bridge portions 211.

As shown in FIGS. 2 and 3, a welding end (indicated by A in FIG. 2) of the annular bridge portion 211 is located above a portion (intermediate portion indicated by B in FIG. 2) of the lower member 209 that partitions two adjacent refrigerant flow paths 152 disposed in the arc-shaped manner inside the lower member 209. That is, when viewed from above, in a state where the upper member 207, the intermediate member 208, and the lower member 209 are welded to one another to form the base material 108, a region of a welding end A of each annular bridge portion 211 of the upper member 208 is projected so as to overlap a region of an upper end of an intermediate portion B of the lower member 209 between the same two adjacent annular refrigerant flow paths 152. Further, a width in a radial direction of the wafer placement electrode 120 of the welding end A of the annular bridge portion 211 of the vacuum insulating space 205 constituting the welding surface 206 with respect to the intermediate member 208 is set to be a minimum value within a range in which the vacuum insulating space 205 can be airtightly welded in order to increase thermal resistance between the heater 201 and the refrigerant flow path 152.

In other words, the vacuum insulating space 205 includes at least one arc-shaped space which is multiply disposed about the center of the base material 108 in the vertical direction inside the base material 108 between the refrigerant flow path 152 and the heater 201 and of which the inside is sealed by being reduced to the predetermined degree of vacuum. In addition, the vacuum insulating space 205 is formed such that the region (bridge portion 211) of the portion of the base material 108 between the multiply disposed arc-shaped spaces is projected and overlapped with the region (intermediate portion B) of the intermediate portion of the base material 108 that partitions two adjacent refrigerant flow paths 152 when viewed from above. In addition, the bridge portions 211 between the multiply disposed arc-shaped spaces of the vacuum insulating spaces 205 are disposed at overlapping positions obtained by being projected onto the intermediate portions B that partition the two adjacent refrigerant flow paths 152, respectively, when viewed from above.

On the other hand, the width in the radial direction of the wafer placement electrode 120 of the portion B between the two adjacent flow paths of the refrigerant flow path 152 is required to allow sufficient heat exchange between the refrigerant flowing through the refrigerant flow path 152 and the portion B of the lower member 209, and does not need to be made unnecessarily small. Therefore, it is desirable that a width of the welding surface A and a width of the welding surface B satisfy (width of) A≤(width of) B. In other words, a size (A) in the radial direction of the bridge portion 211 is smaller than a size (B) in the radial direction of the intermediate portion between the two adjacent refrigerant flow paths 152 (A≤B).

However, when the width of the region of the welding end A is small, in a step of welding the upper member 207 and the intermediate member 208 or the lower member 209, when a mechanical load is applied to these members from the vertical direction, a load sufficient for welding or airtightly sealing may be not applied to the welding end A and cause a welding failure. On the other hand, in the present embodiment, the region of the welding end A of the annular bridge portion 211 when viewed from above is similarly projected within the region of the annular intermediate portion B, the load is sufficiently applied to the region of the welding end A, and it is possible to prevent an occurrence of the welding failure between the upper member 207 and the intermediate member 208 or the lower member 209.

In the wafer placement electrode 120 in which the base material 108 is formed as described above, when the heat is transferred between the heater 201 and the refrigerant flow path 152, an amount of heat transferred per unit time (heat transfer effect) between the upper member 207 including the bridge portion 211 including the welding end A constituting the welding surface 206 and the intermediate member 208 is affected by an area of the region of the welding end A of the bridge portion. Therefore, there is a concern that a distribution of the temperature appearing on the placement surface 120a of the wafer placement electrode 120 or the surface of the wafer 109 due to the heat generation from the heater 201 becomes non-uniform.

In order to reduce a variation in the distribution of the temperature of the placement surface 120a or the wafer 109 as described above, in the present embodiment, a thickness (thickness of the upper member 207 indicated by C in FIG. 2) of the base material 108 in an upper portion of the vacuum insulating space 205 in the vertical direction is relatively large. By reducing the variation in the temperature in an in-plane direction of the placement surface 120a inside the upper portion of the base material 108 having the thickness C, it is possible to reduce the variation in the temperature in the in-plane direction of the placement surface 120a or the wafer 109 and a deviation from a target temperature.

On the other hand, a distance in the vertical direction between the vacuum insulating space 205 and the refrigerant flow path 152, that is, a thickness D (indicated by D in FIG. 2) of the intermediate member 208 in the present embodiment, may be a minimum thickness that can airtightly define the vacuum insulating space 205 or the refrigerant flow path 152 and can have a strength for implementing flatness of the base material 108 required for the plasma processing apparatus 100 on a premise of an increase in a change rate in the temperature or responsiveness when the temperature of the wafer placement electrode 120 or the wafer 109 is reduced. Therefore, it is desirable that the widths of the thickness C and the thickness D inside the base material 108 satisfy the relationship of C≥D. In other words, the distance C between the upper surface of the base material 108 and the upper end of the arc-shaped space of the vacuum insulating space 205 is larger than the distance D between the upper end of the refrigerant flow path 152 and the lower end of the arc-shaped space of the vacuum insulating space 205 (C≥D).

According to the embodiment described above, the amount of heat generated by the heater 201 flows into the refrigerant flow path 152 via the bridge portion 211 of the vacuum insulating space 205, so that the thermal resistance to the refrigerant flow path 152 as viewed from the heater 201 can be increased, and a cooling effect can be intentionally reduced.

With the above configuration, in the present embodiment, when the power is supplied to the heater 201 of the wafer placement electrode 120 to increase the temperature of the placement surface 120a or the wafer 109, the amount of heat exchanged with the refrigerant flowing through the refrigerant flow path inside the base material 108 is reduced, and it is possible to set the temperature of the wafer 109 to a temperature suitable for processing with smaller power or to maintain the temperature. In addition, it is possible to prevent the heater electrode DC power supply 127 that applies power to the heater 201 that is operated as described above from having an excessively large power capacity or current capacity, and it is possible to highly efficiently maintain the placement surface 120a or the wafer 109 at a high temperature.

Next, a modification of the embodiment shown in FIG. 3 will be described with reference to FIG. 4 and subsequent figures.

In the modification shown in FIG. 4, similarly to the embodiment shown in FIG. 3, the vacuum insulating layer space 205 and the bridge portion 211 multiply disposed (three in this example) inside the base material 108 of the wafer placement electrode 120 are arranged, and the slit portion 210 is provided. The slit portion 210 penetrates between the inner peripheral side wall surface and the outer peripheral side wall surface of the bridge portion 211 which partitions the vacuum insulating layer spaces 205 adjacent to each other in the radial direction of the vacuum insulating layer spaces 205 multiply disposed at different radial positions in the radial direction from the center of the upper member 207 of the base material 108 having a cylindrical shape or a circular plate shape, and communicates the multiply vacuum insulating layer spaces 205 arranged at two radial positions separated by the bridge portion 211. In the present modification, the vacuum insulating layer spaces 205 disposed at different radial positions and communicating with each other through the slit portions 210 are to be one space being depressurized to a predetermined degree of vacuum. Such a slit portion 210 may be disposed not only in one bridge portion 211 that separates specific two adjacent vacuum insulating layer spaces 205 among the multiply arranged layers, but also in a plurality of bridge portions 211 disposed at different radial positions, and or a plurality of slit portions 210 may be provided in one bridge portion 211.

The base material 108 of the wafer placement electrode 120 shown in the present example shown in FIG. 4 is formed by welding the upper member 207, the intermediate member 208, and the lower member to each other in the vertical direction. In the wafer placement electrode 120 shown in FIG. 2, grooves which are concentrically or spirally arranged with a predetermined width and depth in the radial direction in the lower portion of the upper member 207 and have openings in the circular flat lower surface are formed, then the lower surface and the flat upper surface of the intermediate member 208 being in contact with each other and the contact portion being bonded as the welding surface 206, so that the vacuum insulating layer space 205 surrounded by the inner wall of the groove of the upper member 207 and the upper surface of the intermediate member 208 is formed. The assembly of the base material 108 is performed by bonding the upper member 207 and the intermediate member 208 to each other by bleeding, diffusion welding, or the like in a bonding processing container (not shown) depressurized to a predetermined degree of vacuum to thus obtain a desired thermal resistance.

In this assembling process, since high heat or external force such as heating or pressure is applied to the two members that are in contact with each other via the welding surface 206, there is a concern that a substance such as moisture remaining on the surfaces of the two members is volatilized on the welding surface 206 and out-gas is generated. In the example shown in FIG. 3, such out-gas may be retained in each of the vacuum insulating layer spaces 205 disposed in multiple layers separated from each other. Here, when the amount of the out-gas of each vacuum insulating layer space 205 is non-uniform, the pressure or the degree of vacuum of each vacuum insulating layer space 205 varies, and a difference occurs in the thermal resistance between the refrigerant flow path 152 and the semiconductor wafer 109 or the placement surface 120a via each vacuum insulating layer space 205. As a result, the temperature distribution of the semiconductor wafer 109 placed on the wafer placement electrode 120 varies in the in-plane direction and becomes uneven.

In the present example shown in FIG. 4, a slit portion 210 is provided to communicate the vacuum insulating layer spaces 205 multiply disposed at different positions in the radial direction. Accordingly, even if the out-gas is generated when the upper member 207 and the intermediate member 208 constituting the base material 108 are joined to each other and stays in the vacuum insulating layer space 205, the out-gas is dispersed in the entire multiply vacuum insulating layer space 205 communicated with the slit portion 210. Accordingly, the influence of the generation of the out-gas on the internal pressure of the vacuum insulating layer space 205 is reduced, and thus the internal pressure of the vacuum insulating layer space 205 can be made close to a uniform pressure.

Further, in the present example shown in FIG. 4, the bridge portion 211 that partitions the vacuum insulating layer spaces 205 arranged concentrically or spirally at different positions in the radial direction includes a plurality of slit portions 210, and the slit portions 210 are arranged on one straight line in the radial direction extending radially outward from the center of the concentric or spiral arrangement. That is, when the outer peripheral direction of the straight line in the radial direction is viewed from the center, the projected regions of the plurality of openings of the slit portion 210 penetrating between the inner peripheral wall surface and the outer peripheral wall surface of the plurality of bridge portions 210 are provided at overlapping positions. Therefore, the openings of the plurality of slit portions 211 may have the same dimensions and shapes, or may have different shapes and dimensions, and the regions of the respective openings can be arranged to overlap one straight line extending from the center to the outer periphery.

Also in the present example shown in FIG. 4, the upper member 207 and the intermediate member 208 of the base material 108 are joined to each other at the welding surface 206 in the container at a predetermined degree of vacuum. At this time, when the out-gas is generated from the joint surface 206, the out-gas flows out to the center side or the outer peripheral side in the radial direction from the vacuum insulating layer space 205 concentrically or spirally formed in multiple layers or a gap between the intermediate member 208 and the bottom surface of the portion serving as the bridge portion 211 separating the multiple grooves formed in the bottom portion of the upper member 207. The out-gas passes through the slit portions 210, which are arranged to be overlapped in the radial direction, extending in one radial shape, and is easily diffused into the vacuum insulating layer space 205 at different radial positions separated by the bridge portion 211. Accordingly, it is possible to effectively suppress the variation in the pressure inside the multiply vacuum insulating layer space 205 due to the out-gas and the variation in the heat transfer coefficient inside the base material 108 in the radial direction or the circumferential direction due to the variation in the pressure inside the multiply vacuum insulating layer space 205, to reduce the unevenness in the temperature of the wafer 109, and to thus make the temperature in the surface (in the plane) of the wafer 109 uniform.

In the example shown in FIG. 4, the plurality of slit portions 210 penetrating through the respective bridge portions 211 are disposed with overlapping the openings on one straight line in the radial direction extending in a radial shape from the center as described above. FIG. 5 is a plan view showing a schematic configuration of the vacuum insulating layer space of the wafer stage according to another modification of the example illustrated in FIG. 3.

In the example of FIG. 5, the straight lines extending from the center where the openings of the plurality of slit portions 210 may be arranged so as to overlap each other to the outer periphery become three lines at equal angles around the central axis in the vertical direction of the base material 108 or the wafer placement electrode 120. In o other words, on a plane perpendicular to the central axis, each of three straight lines forming an angle of 120 degrees may be arranged so as to overlap the openings of the slit portions 210 belonging to the set. In this way, the number of passages or the cross-sectional area of the passage connecting adjacent vacuum insulating layer spaces 205 multiply disposed is increased. The generated outside gas is effectively diffused into the vacuum insulating layer space 205 which is communicated and formed as one space. On the other hand, increasing the number of slit portions 210 and the number of sets of the slit portions 210 leads to a reduction in the area of the joint surface 206 and may reduce the mechanical strength of the base material 108, and thus it is necessary to dispose the slit portion 210 in a range in which sufficient strength can be maintained.

With reference to FIGS. 6A and 6B, the configuration of the slit portion 210 of the embodiment and the modification will be described. FIG. 6A is a perspective view showing a schematic configuration of a first configuration example having a bridge portion including a slit portion that communicates adjacent vacuum insulating layer spaces in a wafer stage, according to the modification shown in FIGS. 4 and 5. FIG. 6B is a perspective view showing a schematic configuration of a second configuration example having a bridge portion including a slit portion that communicates adjacent vacuum insulating layer spaces in a wafer stage, according to the modification shown in FIGS. 4 and 5.

FIGS. 6A and 6B schematically show, in the wafer placement electrode 120 shown in FIG. 2, a bridge portion 211, which partitions the inner peripheral side, the outer peripheral side, and both sides by being sandwiched between two ring-shaped vacuum insulating layer spaces 205 arranged at different radial positions among the vacuum insulating layer spaces 205 multiply disposed, and a slit portion 210, which penetrates the bridge portion 211 in the radial direction of the base material 108 and communicates the vacuum insulating layer spaces 205 on both sides. E1 illustrated in FIG. 6A indicates the height of the slit portion 210, and indicates a case where the height E1 of the slit portion 210 has a height E0 from the upper end (top surface) to the lower end (bottom surface) of the vacuum insulating layer space 205 (E1=E0). That is, FIG. 6A illustrates that the height E0 from the upper end (top surface) to the lower end (bottom surface) of the vacuum insulating layer space 205 or the bridge portion 211 constituting the inner peripheral wall and the outer peripheral wall thereof is the same as the vertical size (height) E1 of the opening of the slit portion 210. On the other hand, E2 illustrated in FIG. 6B is the height of the opening portion of slit portion 210, and the lower end portion thereof has a size from the upper end (top surface) of the side wall surface of bridge portion 211 to a position in the middle of reaching the lower end (bottom surface). Here, it is shown that the height E2 is smaller than the height E1 and the height E0 (E1>E2, E0>E2).

The upper member 207 and the intermediate member 208 are joined on the welding surface 206. Specifically, in the case of welding at a high temperature, it is desirable that the temperature value is not increased or decreased (high or low) in a specific region or place in the welding surface 206, there is no so-called temperature spot, and the temperature variation is suppressed in the entire welding surface 206. Under this condition (condition where there is no temperature spot), the variation in the strength of the welding between the upper member 207 and the intermediate member 208 is reduced in the welding surface 206 having a plurality of locations and regions, and the result of the stable welding between the upper member 207 and the intermediate member 208 can be obtained.

However, in the case of the second configuration example shown in FIG. 6B, a part of the upper member 207 constituting the bridge portion 211 exists between the opening portion of the slit portion 210 and the lower welding surface 206. Therefore, the amount and characteristics of heat transfer are different between the welding surface 206 below the opening portion of the slit portion 210 and a portion where the height of the bridge portion 211 is equal to the upper end (top surface) and the lower end (bottom surface) of the vacuum insulating layer space 205 or the inner peripheral wall and the outer peripheral wall thereof, and the amount of heat transfer in the vertical direction inside the base material 108 is locally varied, and there is a portion where the temperature of the wafer 109 placed on the upper side of this portion and another portion is uneven, and thus the bonding may be partially weakened. Here, in the present embodiment and the modification, the height E1 of the slit portion 210 is set to a height E0 (E1=E0) from the upper end (top surface) to the lower end (bottom surface) of the vacuum insulating layer space 205.

In the above embodiment, the vacuum insulating layer space 205 is disposed such that the projected region overlaps a periphery of a corresponding one of the multiply refrigerant flow paths 152. That is, the periphery of the annular vacuum insulating layer space 205 partitioned by the bridge portion 211 overlaps directly above a periphery of the corresponding refrigerant flow path 152. The arrangement of the vacuum insulating layer space 205 and the refrigerant flow path 152 is not limited to such a configuration, and the arc-shaped vacuum insulating layer space 205 may be located over a plurality of peripheries of the lower refrigerant flow paths 152, and may be disposed at a position where the bridge portion 211 partitioning the space is projected to overlap an upper side of the intermediate portion B partitioning an outermost periphery or an innermost periphery of the plurality of peripheries of the refrigerant flow paths 152.

Further, the sealed vacuum insulating layer space 205 multiply disposed in the annular shape may be configured with a single space or a plurality of spaces. That is, it may be configured with a plurality of spaces in a circumferential direction or a radial direction. The vacuum insulating layer space 205 may be a plurality of ring-shaped spaces disposed in the concentric shape 301, or may be a single space in the spiral shape 302.

In addition, each periphery of a plurality of spaces multiply disposed in a ring shape may be configured with a plurality of arc-shaped spaces, and each arc-shaped space may not be disposed at the same radial direction position from the center. Even in this case, the region of the bridge portion 211 between the arc-shaped spaces overlaps the region of the intermediate portion B that partitions the adjacent refrigerant flow paths 152 below when viewed from above.

Further, a material to be etched of the film layer to be processed included in the film structure disposed on the upper surface of the wafer 109 in advance before the processing is a silicon oxide film, and tetrafluoromethane gas, oxygen gas, and tetrafluoride methane gas are used as a processing gas for etching the film to be processed and a cleaning gas for cleaning, which are supplied to the processing chamber 104. Further, as the material of the film layer to be processed, not only the silicon oxide film, but also a polysilicon film, a photo resist film, an antireflection organic film, an antireflection inorganic film, an organic material, an inorganic material, a silicon oxide film, a silicon nitride oxide film, a silicon nitride film, a Low-k material, a High-k material, an amorphous carbon film, a Si substrate, a metal material, or the like may be used, and even when these materials are used, the same effect can be obtained.

As the processing gas for etching, chlorine gas, hydrogen bromide gas, tetrafluoride methane gas, trifluoride methane gas, difluoride methane gas, argon gas, helium gas, oxygen gas, nitrogen gas, carbon dioxide gas, carbon monoxide gas, hydrogen gas, or the like can be used. As the processing gas for etching, ammonia gas, propane octafluoride gas, nitrogen trifluoride gas, sulfur hexafluoride gas, methane gas, silicon tetrafluoride gas, silicon tetrachloride gas, neon gas, krypton gas, xenon gas, radon gas, or the like may be used.

The present disclosure is not limited to the above-described embodiment, and includes various modifications. For example, the embodiment has been described in detail for easy understanding of the present disclosure, and is not necessarily limited to those having all the configurations described above. For example, the wafer placement electrode 120 may include the heater 201 that is supplied with a current inside the dielectric film 140 and heats the wafer 109 placed thereon, and the controller 170 may regulate the temperature of the wafer 109 by heating the heater 201. Further, in order to regulate the temperature as described above, the wafer placement electrode 120 may be capable of communicating with the controller 170, and at least one temperature sensor for detecting the temperature may be provided inside the base material 108.

Further, a part of a configuration according to a certain embodiment can be replaced with a configuration according to another embodiment, and a configuration according to another embodiment can be added to a configuration according to a certain embodiment. In addition, another configuration can be added to, deleted from, or replaced with a part of a configuration of each embodiment. It should be noted that each member and a relative size described in the drawings are simplified and idealized in order to facilitate understanding of the present disclosure, and have a more complicated shape in terms of mounting.

In the above embodiment, the configuration has been described in which the microwave electric field having a frequency of 2.45 GHZ and the magnetic field capable of forming the ECR by combining the microwave electric field are supplied into the processing chamber 104, and the plasma is formed by discharging the processing gas. However, even when the plasma is formed by using other discharges (magnetic field UHF discharge, capacitive coupling discharge, inductive coupling discharge, magnetron discharge, surface wave excitation discharge, transfer coupled discharge), the configuration described in the above embodiment can achieve the same functions and effects as those described in the above embodiment and the like. In addition, even when the above-described embodiment and modification examples are applied to a wafer placement electrode disposed in another plasma processing apparatus that performs the plasma process, for example, a plasma CVD apparatus, an ashing apparatus, or a surface modification apparatus, the same operation and effect can be obtained.

INDUSTRIAL APPLICABILITY

The present disclosure can be used in a plasma processing apparatus and a manufacturing method of a wafer stage of the plasma processing apparatus.

REFERENCE SIGNS LIST

100: plasma processing apparatus
101: vacuum container
102: shower plate
102a: gas introduction hole
103: dielectric window
104: processing chamber
105: waveguide pipe
106: electric field generating power supply
107: magnetic field generating coil
108: electrode base material
109: semiconductor wafer
110: vacuum exhaust port
111: conductor film
112: ground point
113: susceptor ring
116: plasma 120: wafer placement electrode
120a: placement surface
120b: upper surface
124: radio frequency power supply
125: radio frequency filter
126: DC power supply for electrostatic adsorption
127: DC power supply for heater
129: matching device
140: dielectric film
152: refrigerant flow path
160: electric field and magnetic field forming unit
170: controller
201: heater
202: electrostatic adsorption electrode
203: temperature regulator
204: welding surface
205: vacuum insulating layer
206: welding surface

The invention claimed is:

1. A plasma processing apparatus having a wafer stage, the wafer stage being disposed inside a processing chamber inside a vacuum container and a wafer to be processed being configured to be placed on an upper surface of the wafer stage, the plasma processing apparatus being configured to process the wafer by forming plasma inside the processing chamber, the plasma processing apparatus comprising:

a metallic base material disposed inside the wafer stage and having a cylindrical shape or a circular plate shape;

a dielectric film disposed on an upper surface of the base material, made of a dielectric material and constituting a placement surface on which the wafer is configured to be placed;

a film-shaped heater disposed inside the dielectric film;

a refrigerant flow path multiply disposed in a concentric shape or in a spiral shape about a center of the base material inside the base material and allowing a refrigerant to flow therethrough; and at least one arc-shaped space multiply disposed about the center inside the base material between the refrigerant flow path and the heater and having an inside reduced to a predetermined degree of vacuum and sealed, wherein a bridge portion, which is a region of a portion of the base material between the multiply disposed arc-shaped spaces, is arranged at a position that is projected and overlapped on a region of an intermediate portion of the base material that partitions two of the adjacent refrigerant flow paths when viewed from above, and the plasma processing apparatus further comprises a communication path communicating the two arc-shaped spaces disposed adjacent to each other with the bridge portion interposed therebetween.

2. The plasma processing apparatus according to claim 1, wherein a vertical size of the opening of the communication path is equal to a size from an upper end to a lower end of the communicating arc-shaped space.

3. The plasma processing apparatus according to claim 2, further comprising:

a plurality of the bridge portions, which are regions of portions of the base material and are multiply disposed between the arc-shaped spaces multiply disposed; and a plurality of the communication paths arranged in each of the plurality of bridge portions, wherein the openings of the plurality of communication paths are arranged such that projection planes in a direction from the center to the outer periphery of the base material overlap each other.

4. The plasma processing apparatus according to claim 1, further comprising:

a plurality of the bridge portions, which are regions of portions of the base material and are multiply disposed between the arc-shaped spaces multiply disposed; and a plurality of the communication paths arranged in each of the plurality of bridge portions, wherein the openings of the plurality of communication paths are arranged such that projection planes in a direction from the center to the outer periphery of the base material overlap each other.

5. The plasma processing apparatus according to claim 1, wherein a size of the bridge portion in a radial direction is smaller than a size of the intermediate portion in the radial direction between two adjacent flow paths of the refrigerant flow path.

6. The plasma processing apparatus according to claim 1, wherein a distance between the upper surface of the base material and an upper end of the arc-shaped space is larger than a distance between an upper end of the refrigerant flow path and a lower end of the arc-shaped space.

7. The plasma processing apparatus according to claim 1, wherein a distance between the upper surface of the base material and an upper end of the arc-shaped space is larger than a distance between an upper end of the refrigerant flow path and a lower end of the arc-shaped space.

8. A manufacturing method of a wafer stage of a plasma processing apparatus having a wafer stage, the plasma processing apparatus being disposed inside a processing chamber inside a vacuum container and a wafer to be processed being configured to be placed on an upper surface of the wafer stage, the plasma processing apparatus being configured to process the wafer by forming plasma inside the processing chamber, wherein the wafer stage includes a metallic base material disposed inside the wafer stage and having a cylindrical shape or a circular plate shape, a dielectric film disposed on an upper surface of the base material, made of a dielectric material and constituting a placement surface on which the wafer is configured to be placed, a film-shaped heater disposed inside the dielectric film, a refrigerant flow path multiply disposed in a concentric shape or in a spiral shape about a center of the base material inside the base material and allowing a refrigerant to flow therethrough, and at least one arc-shaped space multiply disposed about the center inside the base material between the refrigerant flow path and the heater and having an inside reduced to a predetermined degree of vacuum and sealed, a bridge portion, which is a region of a portion of the base material between the multiply disposed arc-shaped spaces, is projected and overlapped on a region of an intermediate portion of the base material that partitions two of the adjacent refrigerant flow paths when viewed from above, wherein the arc-shaped space is formed by welding, in a space having a degree of vacuum approximate to the predetermined degree of vacuum, a recess portion formed in advance in at least one of an upper member and a lower member which are welded to each other and constitute the base material, and the other member, and wherein the manufacturing method of the wafer stage of the plasma processing apparatus further comprises a communication path communicating the two arc-shaped spaces disposed adjacent to each other with the bridge portion interposed therebetween.

9. The manufacturing method of the wafer stage of the plasma processing apparatus according to claim 8, wherein a vertical size of the opening of the communication path is equal to a size from an upper end to a lower end of the communicating arc-shaped space.

10. The manufacturing method of the wafer stage of the plasma processing apparatus according to claim 9, further comprising:

a plurality of the bridge portions, which are regions of portions of the base material and are multiply disposed between the arc-shaped spaces multiply disposed; and a plurality of the communication paths arranged in each of the plurality of bridge portions, wherein the openings of the plurality of communication paths are arranged such that projection planes in a direction from the center to the outer periphery of the base material overlap each other.

11. The manufacturing method of the wafer stage of the plasma processing apparatus according to claim 8, further comprising:

a plurality of the bridge portions, which are regions of portions of the base material and are multiply disposed between the arc-shaped spaces multiply disposed; and a plurality of the communication paths arranged in each of the plurality of bridge portions, wherein the openings of the plurality of communication paths are arranged such that projection planes in a direction from the center to the outer periphery of the base material overlap each other.

12. The manufacturing method of the wafer stage of the plasma processing apparatus according to claim 8, wherein a size of the bridge portion in a radial direction is smaller than a size of the intermediate portion in the radial direction between two adjacent flow paths of the refrigerant flow path.

13. The manufacturing method of the wafer stage of the plasma processing apparatus according to claim 8, wherein a distance between the upper surface of the base material and an upper end of the arc-shaped space is larger than a distance between an upper end of the refrigerant flow path and a lower end of the arc-shaped space.

* * * * *